United States Patent
Poppi et al.

(10) Patent No.: US 9,852,874 B2
(45) Date of Patent: *Dec. 26, 2017

(54) ELECTRON EXIT WINDOW FOIL

(71) Applicant: TETRA LAVAL HOLDINGS & FINANCE S.A., Pully (CH)

(72) Inventors: Luca Poppi, Formigine (IT); Anders Kristiansson, Lund (SE); Benno Zigerlig, Untersiggenthal (CH); Werner Haag, Lugnorre (CH); Kurt Holm, Baden (CH); Lars-Åke Näslund, Furulund (SE)

(73) Assignee: TETRA LAVAL HOLDINGS & FINANCE S.A., Pully (CH)

( * ) Notice: Subject to any disclaimer, the term of this patent is extended or adjusted under 35 U.S.C. 154(b) by 0 days.

This patent is subject to a terminal disclaimer.

(21) Appl. No.: 15/198,067

(22) Filed: Jun. 30, 2016

(65) Prior Publication Data

US 2016/0307724 A1 Oct. 20, 2016

Related U.S. Application Data

(62) Division of application No. 13/885,555, filed as application No. PCT/SE2011/051340 on Nov. 9, 2011, now Pat. No. 9,384,934.

(30) Foreign Application Priority Data

Dec. 2, 2010 (SE) ........................ 1051277

(51) Int. Cl.
*H01J 33/04* (2006.01)
*C23C 28/00* (2006.01)
(Continued)

(52) U.S. Cl.
CPC .............. *H01J 33/04* (2013.01); *B32B 37/12* (2013.01); *B32B 37/18* (2013.01); *C23C 28/322* (2013.01);
(Continued)

(58) Field of Classification Search
CPC ........ B32B 2307/302; B32B 2307/714; B32B 37/12; B32B 37/18; C23C 28/322;
(Continued)

(56) References Cited

U.S. PATENT DOCUMENTS 3,607,680 A * 9/1971 Uno .................. G03G 9/00
205/122
3,611,418 A * 10/1971 Uno .................. G03G 9/00
313/420
(Continued)

FOREIGN PATENT DOCUMENTS

CN 1839458 A 9/2006
DE 2501885 A1 7/1976
(Continued)

OTHER PUBLICATIONS

International Search Report (PCT/ISA/210) dated Mar. 13, 2012, by the Swedish Patent Office as the International Searching Authority for International Application No. PCT/SE2011/051340.
(Continued)

*Primary Examiner* — Wyatt Stoffa
(74) *Attorney, Agent, or Firm* — Buchanan Ingersoll & Rooney PC

(57) ABSTRACT

An electron exit window foil for use with a high performance electron beam generator operating in a corrosive environment is provided. The electron exit window foil comprises a sandwich structure having a film of Ti, a first layer of a material having a higher thermal conductivity than Ti, and a flexible second layer of a material being able to
(Continued)

protect said film from said corrosive environment, wherein the second layer is facing the corrosive environment.

16 Claims, 3 Drawing Sheets

(51) Int. Cl.
    *B32B 37/12*     (2006.01)
    *B32B 37/18*     (2006.01)
    *H01J 37/30*     (2006.01)
    *H01J 29/00*     (2006.01)
    *G21K 5/04*     (2006.01)

(52) U.S. Cl.
    CPC ........ *C23C 28/345* (2013.01); *C23C 28/3455* (2013.01); *H01J 29/006* (2013.01); *H01J 37/3002* (2013.01); *B32B 2307/302* (2013.01); *B32B 2307/714* (2013.01); *G21K 5/04* (2013.01); *H01J 2237/164* (2013.01); *Y10T 29/49002* (2015.01); *Y10T 156/10* (2015.01)

(58) Field of Classification Search
    CPC .... C23C 28/345; C23C 28/3455; G21K 5/04; H01J 2237/164; H01J 29/006; H01J 33/04; H01J 37/3002; H01J 3/027
    See application file for complete search history.

(56) References Cited

U.S. PATENT DOCUMENTS

| | | | | |
|---|---|---|---|---|
| 5,210,426 A | * | 5/1993 | Itoh | H01J 5/18 219/121.21 |
| 5,489,783 A | | 2/1996 | Kristiansson | |
| 5,561,342 A | * | 10/1996 | Roeder | H01J 33/04 313/359.1 |
| 5,898,261 A | * | 4/1999 | Barker | H01J 33/04 313/20 |
| 6,054,714 A | | 4/2000 | Izutsu et al. | |
| 7,919,763 B2 | * | 4/2011 | Avnery | H01J 33/04 250/492.3 |
| 8,338,807 B2 | * | 12/2012 | Avnery | H01J 33/04 250/492.3 |
| 9,384,934 B2 | * | 7/2016 | Poppi | C23C 28/322 |
| 2002/0048345 A1 | * | 4/2002 | Bachmann | H01J 5/18 378/121 |
| 2002/0135290 A1 | * | 9/2002 | Avnery | H01J 33/04 313/420 |
| 2004/0089820 A1 | | 5/2004 | Rangwalla et al. | |
| 2004/0251229 A1 | * | 12/2004 | Okumura | G03F 1/22 216/2 |
| 2004/0251431 A1 | | 12/2004 | Yamaguchi et al. | |
| 2007/0090303 A1 | * | 4/2007 | Kristiansson | G01R 19/0061 250/492.3 |
| 2008/0181365 A1 | * | 7/2008 | Matoba | H01J 35/08 378/140 |
| 2009/0028297 A1 | * | 1/2009 | Matoba | H01J 35/08 378/140 |
| 2010/0065752 A1 | * | 3/2010 | Daily | B01J 19/085 250/396 R |
| 2010/0065754 A1 | * | 3/2010 | Bromberg | H01J 49/147 250/424 |
| 2010/0155620 A1 | * | 6/2010 | Hutchison | H01J 37/20 250/440.11 |
| 2011/0260075 A1 | * | 10/2011 | Bromberg | H01J 49/147 250/427 |
| 2013/0009077 A1 | * | 1/2013 | Walther | G21K 5/00 250/505.1 |
| 2013/0284587 A1 | * | 10/2013 | Bakhtari | C01B 13/10 204/157.44 |

FOREIGN PATENT DOCUMENTS

| | | |
|---|---|---|
| EP | 0480732 A2 | 4/1992 |
| EP | 0622979 A2 | 11/1994 |
| JP | 59-141467 A | 8/1984 |
| JP | 61-178700 A | 8/1986 |
| JP | 63-218253 A | 9/1988 |
| JP | 8-315759 A | 11/1996 |
| JP | 9-211199 A | 8/1997 |
| JP | 2004-526965 A | 9/2004 |
| MX | 2009004651 A | 9/2010 |
| WO | WO 98/07175 A2 | 2/1998 |
| WO | WO 02/078039 A1 | 10/2002 |

OTHER PUBLICATIONS

Extended European Search Report dated Jun. 9, 2017, issued by the European Patent Office in corresponding European Patent Application No. 11844857.0-1362. (10 pages).

* cited by examiner

ELECTRON EXIT WINDOW FOIL

CROSS REFERENCES TO RELATED APPLICATIONS

This application is a divisional of application Ser. No. 13/885,555, filed Sep. 5, 2014, now allowed, which is a National Stage of PCT/SE2011/051340, filed Nov. 9, 2011 and claims priority to Swedish Patent Application No. 1051277-0, filed Dec. 2, 2010, the disclosures of all of which are incorporated herein by reference in their entirety.

THE FIELD OF THE INVENTION

The present invention refers to an electron exit window foil. More particularly, the present invention relates to an electron exit window foil for use in a corrosive environment and operating at a high performance.

PRIOR ART

Electron beam devices may be used to irradiate objects with electrons, e.g. for surface treatment. Such devices are commonly used within the food packaging industry, where electron beams are providing efficient sterilization of packages, e.g. plastic bottles or packaging material to be later converted into a package.

A main advantage with electron beam sterilization is that wet chemistry, using e.g. $H_2O_2$, may be avoided thus reducing the high number of components and equipment required for such wet environments.

An electron beam device typically comprises a filament connected to a power supply, wherein the filament is emitting electrons. The filament is preferably arranged in high vacuum for increasing the mean free path of the emitted electrons and an accelerator is directing the emitted electrons towards an exit window. The electron exit window is provided for allowing the electrons to escape from the electron beam generator so they may travel outside the electron beam generator and thus collide with the object to be sterilized and release its energy at the surface of the object.

The electron exit window typically consists of thin electron permeable foil that is sealed against the electron beam generator for maintaining the vacuum inside the electron beam generator. A cooled support plate in the form of a grid is further provided for preventing the foil to collapse due to the high vacuum. Ti is commonly used as the foil material due to its reasonable good match between high melting point and electron permeability, as well as the ability to provide thin films.

A problem with a Ti film is that it may oxidize, leading to reduced lifetime and operational stability. In order to achieve a long lifetime of the exit window, a maximum temperature of approximately 250 C should not be exceeded during the operation of the electron beam device. Typically, a high performance electron beam device is designed to provide 22 kGy at up to 100 m/min at 80 keV when used for sterilizing a running web of material. A plain Ti foil may thus not be used with such high performance electron beam devices, since the amount of emitted electrons transmitted through the window may cause temperatures well above this critical value.

In filling machines, i.e. machines designed to form, fill, and seal packages, sterilization is a crucial process not only for the packages, but for the machine itself. During such machine sterilization, which preferably is performed during start-up, the outside of the exit window will be exposed to the chemicals used for machine sterilization. A highly corrosive substance such as $H_2O_2$, which is commonly used for such applications, will affect the exit window by means of etching the Ti.

Different solutions for improving the properties of the exit window have been proposed to overcome the above-mentioned drawbacks.

EP0480732B describes a window exit foil consisting of a Ti foil, and a protective layer of Al that is forming an intermetallic compound by thermal diffusion treatment of the Ti/Al construction. This solution may be suitable for relatively thick exit windows, i.e. windows allowing a protective layer being thicker than 1 micron. However, an intermetallic compound is not acceptable on a thin Ti foil since it would reduce its physical strength.

EP0622979A discloses a window exit foil consisting of a Ti foil and a protective layer of silicon oxide on the side of the exit foil facing the object to be irradiated. Although the Ti foil may be protected by such layer, silicon oxide is very brittle and may easily crack in the areas where the foil is allowed to flex, i.e. the areas between the grids of the supportive plate when vacuum is provided. This drawback is making the foil of EP0622979A unsuitable for applications where the exit foil is exhibiting local curvatures, such as electron beam devices using a grid-like cooling plate arranged in contact with the exit foil.

SUMMARY OF THE INVENTION

An object of the present invention is to reduce or eliminate the above-mentioned drawbacks.

A further object is to provide an electron exit foil that is able to decrease the heat load as well as the corrosion on the foil.

An idea of the present invention is thus to provide an electron beam generator having a prolonged operating lifetime, requiring a reduced service, and being more cost-effective than prior art systems due to inexpensive coating processes and the appliance of well-established X-ray manufacturing processes.

According to a first aspect of the invention, an electron exit window foil for use with a high performance electron beam generator operating in a corrosive environment is provided. The electron exit window foil comprises a sandwich structure having a film of Ti, a first layer of a material having a higher thermal conductivity than Ti, and a flexible second layer of a material being able to protect said film from said corrosive environment, wherein the second layer is facing the corrosive environment.

The first layer may be arranged between the film and the second layer, or the film may be arranged between the first layer and the second layer.

The second layer may comprise at least two layers of different materials, which is advantageous in that different mechanical and/or physical properties of the foil, such as erosion resistance and strength, may be tailor made for the particular application.

The first layer may be selected from a group consisting of materials having a ratio between thermal conductivity and density being higher than of Ti.

The first layer may be selected from the group consisting of Al, Cu, Ag, Au, or Mo, and the second layer may be selected from the group consisting of $Al_2O_3$, Zr, Ta, or Nb.

The corrosive environment may comprise $H_2O_2$. Hence, the foil may be implemented in electron beam devices operating in machines being subject to corrosive sterilizing agents, such as for example filling machines within the food packaging industry.

The electron exit window foil may further comprise at least one adhesive coating between the Ti film and first layer or the second layer. Said adhesive coating may be a layer of $Al_2O_3$ or $ZrO_2$ having a thickness between 1 and 150 nm. This is advantageous in that any reaction or material diffusion is prevented at the film/layer interface or the adhesion between the Ti film and a layer or between two layers is improved.

According to a second aspect, an electron beam generator configured to operate in a corrosive environment is provided. The electron beam generator comprises a body housing and protecting an assembly generating and shaping the electron beam, and a support carrying components relating to the output of the electron beam, said support comprising an electron exit window foil according to the first aspect of the invention.

The advantages of the first aspect are also applicable for the second aspect of the invention.

According to a third aspect of the invention, a method for providing an electron exit window foil for use with a high performance electron beam generator operating in a corrosive environment is provided. The method comprises the steps of providing a film of Ti, providing a first layer of a material having a higher thermal conductivity than Ti onto a first side of said film, and providing a flexible second layer of a material being able to protect said film from said corrosive environment, wherein the second layer is facing the corrosive environment.

The step of providing a flexible second layer may comprise arranging said flexible second layer onto a second side of said film.

The step of providing a flexible second layer may comprise arranging said flexible second layer onto said first layer.

At least one of steps of providing a first layer or providing a flexible second layer may be preceded by a step of providing an adhesive coating onto said film.

According to a fourth aspect of the invention, a method for providing a high performance electron beam device is provided. The method comprises the steps of attaching a film of Ti onto a frame, processing said film by providing a first layer of a material having a higher thermal conductivity than Ti onto a first side of said film, and providing a flexible second layer of a material being able to protect said film from said corrosive environment, wherein the second layer is facing the corrosive environment, and attaching said foil-frame subassembly to a tube housing of an electron beam device for sealing said electron beam device.

The advantages of the first aspect of the invention are also applicable for the third and the fourth aspects of the invention.

BRIEF DESCRIPTION OF THE DRAWINGS

In the following, exemplary embodiments of the invention will be described in greater detail, with reference to the enclosed drawings, in which.

DESCRIPTION OF PREFERRED EMBODIMENTS

Figure 1:
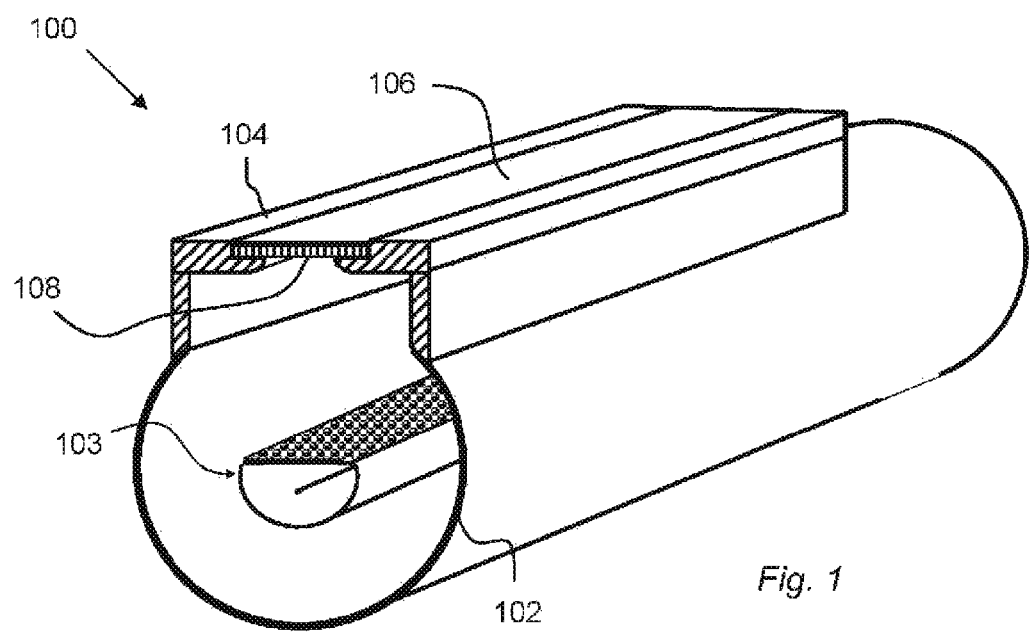
FIG. 1 is a schematic cross sectional isometric view of an electron beam device according to prior art.

With reference to FIG. 1 an electron beam device is shown. The electron beam device 100 comprises two parts; a tube body 102 housing and protecting an assembly 103 generating and shaping the electron beam, and a supportive flange 104 carrying components relating to the output of the electron beam, such as a window foil 106 and a foil support plate 108 preventing the window foil 106 from collapsing as vacuum is established inside the device 100. Further, during operation of the electron beam device the foil 106 is subject to excessive heat. Thereby, the foil support plate 108 also serves the important purpose of conducting heat generated in the foil 106 during use away from the foil 106 of the device. By keeping the foil temperature moderate a sufficiently long lifetime of the foil 106 may be obtained.

Figure 2:
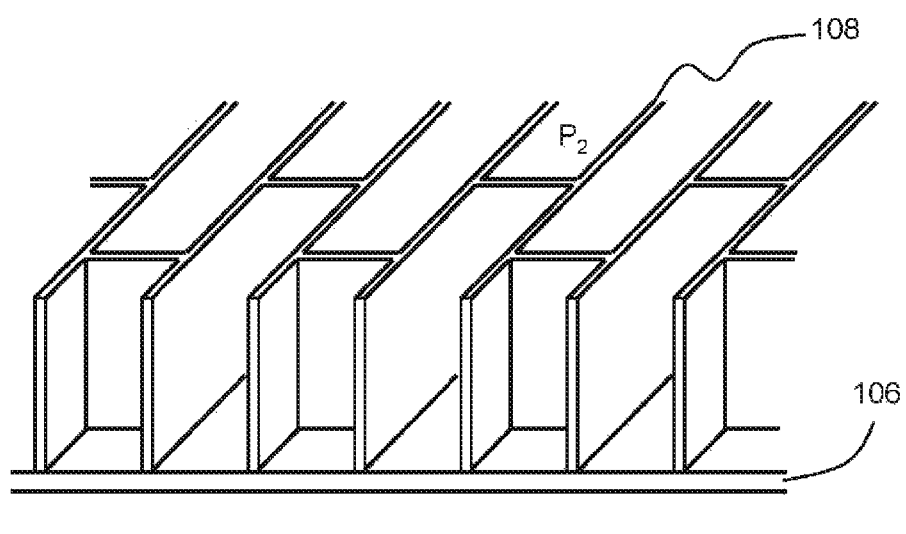
FIG. 2 is a schematic cross sectional perspective view of an electron exit window foil and a foil support plate.

With reference to FIG. 2, an electron exit window is shown comprising the foil 106 and the foil support 108. The support 108 is arranged inside the electron beam device such that vacuum is maintained on the inside of the exit window. This is indicated by $P_1$ and $P_2$ in FIG. 2, where $P_1$ denotes atmospheric pressure outside the exit window and $P_2$ represents vacuum on the inside.

During manufacturing, the foil support plate 108, being of copper, is preferably attached to the flange 104 forming a part of the tube body 102. The flange 104 is generally made of stainless steel. The window foil 106 is then bonded onto a separate frame thus forming a foil-frame sub assembly. The foil 106 is subsequently coated, in order to improve its properties regarding for instance heat transfer. The foil-frame subassembly is subsequently attached to the tube body 102 to form a sealed housing.

In an alternative embodiment, the exit window foil 106 is attached directly to the flange, being attached to the support plate, before the flange is welded to the tube body.

In this embodiment, the exit window foil is consequently coated prior to being attached to the tube body 102.

With reference to FIG. 3a-f, different embodiments of an electron exit window foil 106a-f are shown.

Figure 3A:
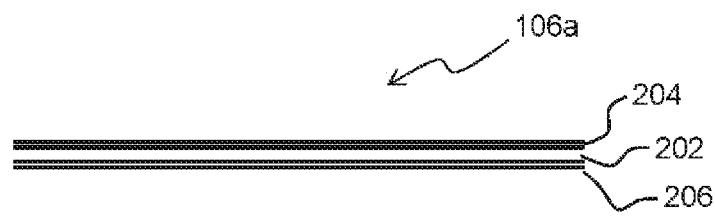
FIG. 3a-f are schematic cross sections of electron exit window foils according to different embodiments.

Starting with FIG. 3a, the foil 106a comprises a thin film of Ti 202. The Ti film 202 has a thickness of approximately 5 to 15 microns. On a first side of the Ti film 202, a thermally conductive layer 204 is arranged. The thermally conductive layer 204 is provided in order to transfer heat along the exit foil such that a reduced temperature is achieved across the entire foil 106. The thermally conductive layer 204 is provided by means of any suitable process, such as sputtering, thermal evaporation, etc, and should allow for a sufficient improvement in thermal conductivity for lowering the temperature of the electron exit window foil 106a while still allowing the foil to bend into the apertures of the support plate 108 when vacuum is applied. Preferably, the material of the thermally conductive layer 204 is chosen from the group consisting of Al, Cu, Ag, Au, and Mo. Although other materials, such as Be, may have a higher ratio between thermal conductivity and density they are considered as poisonous and hence not preferred, especially in applications in which the electron beam device is arranged to process consumer goods.

On the other side of the Ti film a protective layer 206 is arranged. The protective layer 206 is provided by means of any suitable coating process, such as sputtering, thermal evaporation, etc. Preferably, the material of the protective layer is chosen from the group consisting of Al2O3, Zr, Ta, and Nb due to their resistance against hydrogen peroxide containing environments. It should thus be understood that the protective layer 206 is facing the atmospheric environment, i.e. the objects to be sterilized.

The thickness of the thermally conductive layer 204 is preferably between 1 and 5 microns and the thickness of the protective layer 206 is substantially less than 1 micron. Preferably, the thickness of the protective layer 206 is approximately 200 nm. By keeping the window foil 106 as thin as possible, the electron output is maximized. The thickness of the protective layer 206 should thus be designed such that it is capable of protecting the Ti film from a) corrosion by hydrogen peroxide or other aggressive chemical agents which may be provided in the particular application, and b) corrosion caused by the plasma created by the electrons in the air. Further, the thickness of the protective layer 206 should ensure tightness and physical strength, such that the second layer 206 is flexible in order to allow the entire foil to bend and conform to the apertures of the support plate 108 when vacuum is applied. A yet further parameter may be the density, for allowing electron transmittance through the protective layer 206.

By arranging the thermally conductive layer 204 and the protective layer 206 on opposite sides of the Ti foil, stress in the layers may be reduced. For example, if using Al as the thermally conductive layer and Zr as the protective layer, the Ti foil arranged in between those layers will reduce some of the stress induced upon heating. This is due to the fact that the coefficient of thermal expansion of Ti lies between the corresponding value of Al and Zr.

Figure 3B:
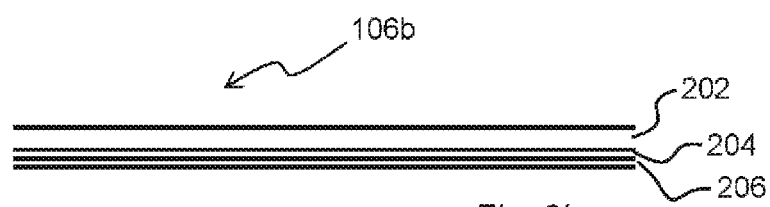

FIG. 3b shows another embodiment of a foil 106b. Here, the thermally conductive layer 204 and the protective layer 206 are provided on the same side of the Ti film 202 such that the protective layer 206 is coated directly on the thermally conductive layer 204. This structure may be advantageous for electron beam devices, for which the electron exit window foil must be mounted to the tube housing before coating, i.e. not allowing coating of the side of the Ti foil facing the interior of the electron beam device.

Figure 3C:
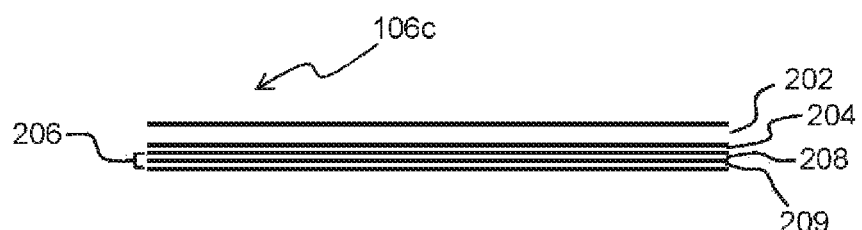
Figure 3D:
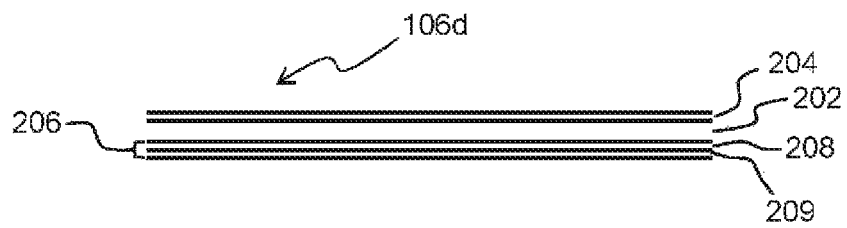

FIGS. 3c and 3d show two different embodiments similar to what has been previously described with reference to FIGS. 3a and b. However, in FIGS. 3c and 3d the protective layer 206 comprises at least two layers of different materials; a first layer 208 and a second layer 209. The first layer 208 and the second layer 209 of the protective layer 206 are both selected from the group consisting of Al$_2$O$_3$, Zr, Ta, and Nb, or alloys thereof. It should however be understood that each one of the layers 208, 209 could per se be a sandwich of two or more protective layers.

For example, the corrosion protection layer 206 itself could be a multilayer structure comprising an oxide, a metal, an oxide, a metal, etc. According to a specific embodiment such multilayer structure may be formed by a first layer of ZrO$_2$, a second layer of Zr, a third layer of ZrO$_2$, and a fourth layer of Zr. This is advantageous in that a potential disruption in one of the sub layers does not induce a significant reduction of the overall corrosion protection of the protective layer 206.

In order to achieve good adherence between the different layers/films of the electron exit window foil, adhesive barrier coatings may be provided at the interface. Such coatings may be a thin layer of Al$_2$O$_3$ or ZrO$_2$, having a thickness between 1 to 150 nm, preferably between 50 and 100 nm. The use of such coatings is advantageous in that they prevent any reaction or diffusion of material at the interface between Ti and the thermally conductive layer and/or the protective layer. Reaction or diffusion may result in the formation of an intermetallic compound which negatively changes the characteristics of the materials involved. In the case of a thin Ti foil it may get reduced physical strength. Further, the presence of intermetallic compounds may reduce the thermal conductivity and the corrosion protective ability of the thermally conductive layer 204 and the protective layer 206 respectively.

Figure 3E:
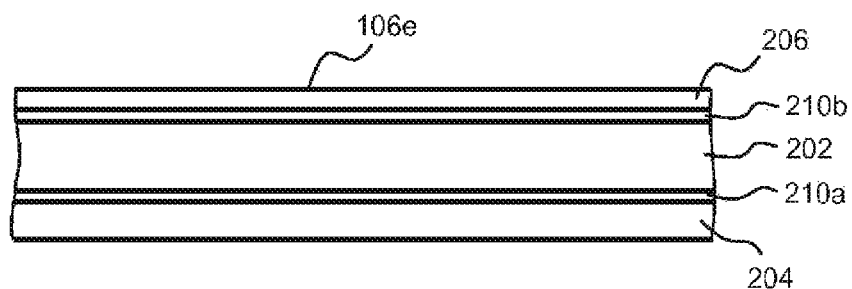

FIG. 3e describes a further embodiment similar to that of FIG. 3a but provided with barrier coatings of the kind described above. The electron exit window foil 106e comprises a sandwich structure having a film of Ti, a first layer 204 of Al having a higher thermal conductivity than Ti, and a flexible second layer 206 of Zr being able to protect said film 202 from a corrosive environment, wherein the second layer 206 is facing the corrosive environment.

The thermally conductive layer 204 of aluminium (Al) is arranged on a first side of the titanium (Ti) foil. A first barrier coating 210a of zirconium oxide (ZrO$_2$) is provided in between said Ti film 202 and said Al layer 204. On the other side of the Ti film 202 the protective layer 206 of zirconium (Zr) is arranged. A second barrier coating 210b of zirconium oxide (ZrO$_2$) is provided in between the Ti film and the Zr layer 206. This embodiment is advantageous in that the Ti foil 202 is surrounded on one side by Al as the thermally conductive layer and on the other side by Zr as the protective layer. Since the coefficient of thermal expansion of Ti lies between the corresponding values of Al and Zr, some of the stress induced during heating of the foil will be reduced. As an alternative one or both of the barrier coatings 210a, 210b may instead be made of aluminium oxide (Al$_2$O$_3$). It is an advantage if the barrier coatings are based on a material provided in either the thermally conductive layer or in the protective layer. For example, if the protective layer is zirconium and the thermally conductive layer is aluminium, it is preferred that either aluminium oxide or zirconium oxide are used for the barrier coatings. This is due to the fact that the layers are applied by a sputtering machine. In a such machine sputter targets are used, one for each material that should be deposited. One and the same target can be used for both e.g. zirconium and zirconium oxide. The same applies for aluminium and aluminium oxide. Hence, it is preferred if the barrier coating is an oxide of a material used in either the corrosion protection or the thermal conductivity layer.

Figure 3F:
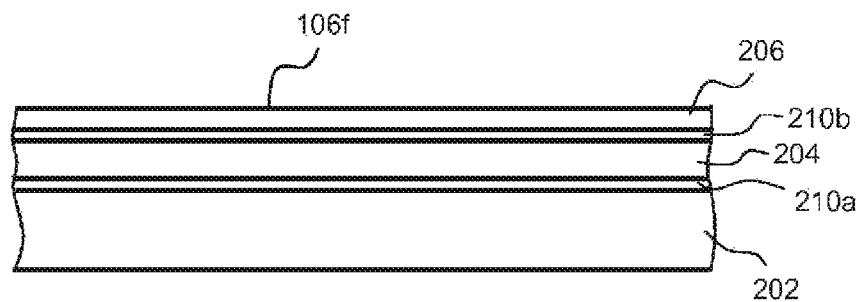

FIG. 3f shows an embodiment similar to that of FIG. 3b but provided with barrier coatings. The electron exit window foil 106f comprises a sandwich structure having a film of Ti, a first layer 204 of Al having a higher thermal conductivity than Ti, and a flexible second layer 206 of Zr being able to protect said film 202 from a corrosive environment, wherein the second layer 206 is facing the corrosive environment. The thermally conductive layer 204 and the protective layer 206 are provided on the same side of the Ti film 202. On top of the Ti film 202 a first barrier coating 210a is coated. The barrier coating 210a is made of aluminium oxide (Al$_2$O$_3$). The thermally conductive layer 204 of aluminium (Al) is coated on said first barrier coating 210a. On the thermally conductive layer 204 there is in turn coated a second barrier coating 210b. Said barrier coating 210b is also made of aluminium oxide (Al$_2$O$_3$). Finally, the protective layer 206, being made of zirconium (Zr), is coated on said second barrier coating 210b. As an alternative one or both of the barrier coatings 210a, 210b may instead be made of zirconium oxide (ZrO$_2$).

In both the embodiments of FIGS. 3e and 3f the protective layer 206 may be a multilayer structure as described in relation to FIGS. 3c and 3d.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. An electron exit window foil for use with a high performance electron beam generator operating in a corrosive environment, the electron exit window foil comprising a sandwich structure having
 a film of Ti,
 a first layer of a material having a higher thermal conductivity than Ti, and
 a flexible second, outermost layer of a material being able to protect said film from said corrosive environment, wherein the second layer is facing the corrosive environment,
 wherein the first layer is arranged between the film and the second layer,
 wherein the first layer is selected from the group consisting of $Al_2O_3$, Zr, Ta, and Nb, and
 wherein the second layer is selected from the group consisting of $Al_2O_3$, Zr, Ta, and Nb.

2. The electron exit window foil according to claim 1, wherein the material of the first layer has a ratio between thermal conductivity and density higher than that of Ti.

3. The electron exit window foil according to claim 1, further comprising at least one adhesive barrier coating.

4. The electron exit window foil according to claim 3, wherein said at least one adhesive barrier coating is a layer of $Al_2O_3$ or $ZrO_2$.

5. The electron exit window foil according to claim 3, wherein said at least one adhesive barrier coating is between the Ti film and the first layer.

6. The electron exit window foil according to claim 3, wherein said at least one adhesive barrier coating is between the first layer and the second layer.

7. The electron exit window foil according to claim 3, wherein said at least one adhesive barrier coating has a thickness between 1 and 150 nm.

8. An electron beam generator configured to operate in a corrosive environment, comprising
 a body housing and protecting an assembly generating and shaping the electron beam, and
 a support carrying components relating to the output of the electron beam, said support comprising an electron exit window foil according to claim 1.

9. A method for providing an electron exit window foil for use with a high performance electron beam generator operating in a corrosive environment, said method comprising:
 providing a film of Ti,
 providing a first layer of a material having a higher thermal conductivity than Ti onto a side of said film, and
 providing a flexible second, outermost layer of a material being able to protect said film from said corrosive environment, wherein the second layer is configured to face the corrosive environment,
 wherein the film, first layer, and second layer are provided in a manner in which the first layer is arranged between the film and the second layer,
 wherein the first layer is selected from the group consisting of $Al_2O_3$, Zr, Ta, and Nb, and
 wherein the second layer is selected from the group consisting of $Al_2O_3$, Zr, Ta, and Nb.

10. The method according to claim 9, wherein the material of the first layer has a ratio between thermal conductivity and density higher than that of Ti.

11. The method according to claim 9, further comprising providing at least one adhesive barrier coating.

12. The method according to claim 11, wherein said at least one adhesive barrier coating is a layer of $Al_2O_3$ or $ZrO_2$.

13. The method according to claim 11, wherein said at least one adhesive barrier coating is provided between the Ti film and the first layer.

14. The method according to claim 11, wherein said at least one adhesive barrier coating is provided between the first layer and the second layer.

15. The method according to claim 11, wherein said at least one adhesive barrier coating has a thickness between 1 and 150 nm.

16. A method for providing a high performance electron beam device, comprising:
 providing a body housing and protecting an assembly generating and shaping the electron beam, and
 providing a support carrying components relating to the output of the electron beam,
 wherein providing said support comprises providing an electron exit window foil according to the method of claim 9.

* * * * *